United States Patent
Chung et al.

(10) Patent No.: US 8,582,715 B2
(45) Date of Patent: Nov. 12, 2013

(54) STAGE CIRCUIT AND SCAN DRIVER USING THE SAME

(75) Inventors: Bo-Yong Chung, Yongin (KR); Deok-Young Choi, Yongin (KR); Yong-Jae Kim, Yongin (KR)

(73) Assignee: Samsung Display Co., Ltd., Yongin-si (KR)

( * ) Notice: Subject to any disclaimer, the term of this patent is extended or adjusted under 35 U.S.C. 154(b) by 179 days.

(21) Appl. No.: 13/270,981

(22) Filed: Oct. 11, 2011

(65) Prior Publication Data

US 2013/0002340 A1 Jan. 3, 2013

(30) Foreign Application Priority Data

Jun. 30, 2011 (KR) ........................ 10-2011-0064439

(51) Int. Cl.
*G11C 19/00* (2006.01)
(52) U.S. Cl.
USPC ................................ 377/74; 377/64; 327/108
(58) Field of Classification Search
USPC ....................... 377/64, 74; 327/108
See application file for complete search history.

(56) References Cited

U.S. PATENT DOCUMENTS

| | | | | |
|---|---|---|---|---|
| 6,091,393 A * | 7/2000 | Park | ............................. | 345/100 |
| 6,392,627 B1 * | 5/2002 | Maekawa | ........................ | 345/98 |
| 8,068,577 B2 * | 11/2011 | Liao et al. | ........................ | 377/64 |
| 8,081,731 B2 * | 12/2011 | Lin et al. | ........................ | 377/64 |
| 2007/0086558 A1 * | 4/2007 | Wei et al. | ........................ | 377/64 |
| 2012/0269315 A1 * | 10/2012 | Jang et al. | ........................ | 377/75 |
| 2013/0049133 A1 * | 2/2013 | Koyama | ........................ | 257/390 |

FOREIGN PATENT DOCUMENTS

| KR | 10-2008-0044458 A | 5/2008 |
|---|---|---|
| KR | 10-2010-0073294 A | 7/2010 |

* cited by examiner

*Primary Examiner* — Ryan Jager
(74) *Attorney, Agent, or Firm* — Christie, Parker & Hale, LLP

(57) ABSTRACT

A stage circuit is capable of concurrently or progressively supplying scan signals. The stage circuit includes a progressive driver including a first transistor and a second transistor, and a concurrent driver including an $11^{th}$ transistor and a $12^{th}$ transistor. When the first transistor, the second transistor, the $11^{th}$ transistor, and the $12^{th}$ transistor are turned off, lower voltages than voltages applied to source electrodes are applied to gate electrodes such that the transistors can be stably turned off.

27 Claims, 8 Drawing Sheets

VDD>VSS1>VSS2>VSS3

STAGE CIRCUIT AND SCAN DRIVER USING THE SAME

CROSS-REFERENCE TO RELATED APPLICATION

This application claims priority to and the benefit of Korean Patent Application No. 10-2011-0064439, filed on Jun. 30, 2011, in the Korean Intellectual Property Office, the entire content of which is incorporated herein by reference.

BACKGROUND

1. Field

Aspects of embodiments according to the present invention relate to a stage circuit and a scan driver using the same.

2. Description of the Related Art

Recently, flat panel displays (FPDs) with reduced weight and volume in comparison to cathode ray tubes (CRT) have been developed. The FPDs include a liquid crystal display (LCD), a field emission display (FED), a plasma display panel (PDP), and an organic light emitting display.

Among the FPDs, the organic light emitting display displays an image using organic light emitting diodes (OLEDs) that generate light by re-combination of electrons and holes. The organic light emitting display has high response speed and is driven with low power consumption. A typical organic light emitting display supplies current corresponding to data signals to the OLEDs using transistors formed in pixels so that light is emitted by the OLEDs.

The organic light emitting display includes a data driver for supplying the data signals to data lines, a scan driver for progressively supplying scan signals to scan lines, and a display unit including a plurality of pixels coupled to the scan lines and the data lines.

The pixels included in the display unit are selected when the scan signals are supplied to the scan lines to receive the data signals from the data lines. The pixels that receive the data signals generate light components with set or predetermined brightness corresponding to the data signals and display a predetermined image.

On the other hand, the scan driver includes stages respectively coupled to the scan lines. Each of the stages includes a plurality of transistors in order to supply the scan signals to the scan lines. P-type (for example, PMOS) or N-type (for example, NMOS) transistors that constitute the stages are concurrently (e.g., simultaneously) formed in a panel together with the pixels. When the stages are concurrently (e.g., simultaneously) formed in the panel together with the pixels, manufacturing cost may be reduced.

However, when the stage is realized by the N-type transistor, the turn-off of the transistor is not controlled by the threshold voltage (Vth) shift of the transistor so that an erroneous operation is caused. That is, in the case of the N-type transistor, as illustrated in FIG. 1, Vth is negatively shifted with respect to time so that the transistor is not turned off in a state where a voltage Vgs between a gate and a source of the transistor is 0V (that is, Vgs=0V).

On the other hand, a method of driving the organic light emitting display is divided into a progressive emission method and a concurrent emission method. In the progressive emission method, data are progressively input by scan lines, and pixels progressively emit light in units of horizontal lines in the same order as the input of the data.

In the concurrent emission method, data are progressively input by scan lines, and pixels concurrently (e.g., simultaneously) emit light after the data are input to all of the pixels.

In order to realize the concurrent emission method, scan signals are to be concurrently (e.g., simultaneously) or progressively supplied to the scan lines.

SUMMARY

Accordingly, embodiments of the present invention are directed toward a stage circuit capable of stably turning off transistors when a stage is realized using the transistors to improve reliability.

Embodiments of the present invention are directed toward a stage circuit and a scan driver capable of concurrently (e.g., simultaneously) or progressively supplying scan signals.

According to an embodiment of the present invention, there is provided a stage circuit, including a progressive driver including a first transistor coupled between an output terminal and a fifth input terminal of the stage circuit, a gate electrode of the first transistor being coupled to a first node, and a second transistor coupled between the output terminal and a first power source, a gate electrode of the second transistor being coupled to a second node, and a concurrent driver including an $11^{th}$ transistor coupled between a power source voltage and the output terminal, a gate electrode of the $11^{th}$ transistor being coupled to a third node, and a $12^{th}$ transistor coupled between the output terminal and the first power source, a gate electrode of the $12^{th}$ transistor being coupled to a third input terminal of the stage circuit. When the first transistor, the second transistor, the $11^{th}$ transistor, and the $12^{th}$ transistor are turned off, lower voltages than voltages applied to source electrodes are applied to the gate electrodes of the transistors.

The progressive driver may include a third transistor coupled between a seventh input terminal of the stage circuit and the first node, a gate electrode of the third transistor being coupled to the seventh input terminal, a fourth transistor coupled between the third transistor and the first node, a gate electrode of the fourth transistor being coupled to a first input terminal of the stage circuit, a fifth transistor coupled between the first node and a second power source, a gate electrode of the fifth transistor being coupled to a sixth input terminal of the stage circuit, a sixth transistor coupled between the second node and the second power source, a gate electrode of the sixth transistor being coupled to the first node, a seventh transistor coupled between the power source voltage and the second node, a gate electrode of the seventh transistor being coupled to a fourth input terminal of the stage circuit, an eighth transistor coupled between the first node and the second power source, a gate electrode of the eighth transistor being coupled to a third input terminal of the stage circuit, a ninth transistor coupled between the first node and the second power source in parallel with the eighth transistor, a gate electrode of the ninth transistor being coupled to a second input terminal of the stage circuit, and a tenth transistor coupled between the second node and the second power source, a gate electrode of the tenth transistor being coupled to the second input terminal.

The stage circuit may further include a first capacitor coupled between the first node and the output terminal, a third capacitor coupled between the first node and the second power source, and a fourth capacitor coupled between the second node and the second power source. The seventh transistor may include at least two serially coupled transistors. The power source voltage may be set to have a higher voltage than that of the first power source. The first power source may be set to have a higher voltage than that of the second power source.

The first input terminal may be configured to receive a mode control signal. A second input terminal of the stage circuit may be configured to receive a first control signal. A third input terminal of the stage circuit may be configured to receive a second control signal. A fourth input terminal of the stage circuit may be configured to receive a control clock signal. A fifth input terminal of the stage circuit may be configured to receive a clock signal. A sixth input terminal of the stage circuit may be configured to receive an output signal of a next stage. A seventh input terminal of the stage circuit may be configured to receive a start signal or an output signal of a previous stage. The clock signal may swing between the power source voltage and the voltage of the first power source. The mode control signal, the control clock signal, the first control signal, and the second control signal may swing between the power source voltage and a voltage of a third power source that is lower than a voltage of the second power source.

The control clock signal may not overlap the clock signal. The start signal or an output signal of a previous stage may be supplied to overlap the control clock signal.

The concurrent driver may include a $13^{th}$ transistor coupled between the third node and the second power source, a gate electrode of the $13^{th}$ transistor being coupled to the fourth input terminal; a $14^{th}$ transistor coupled between the third node and the second power source, a gate electrode of the $14^{th}$ transistor being coupled to the third input terminal; a $15^{th}$ transistor coupled between the power source voltage and the third node, a gate electrode of the $15^{th}$ transistor being coupled to the second input terminal; and a second capacitor coupled between the third node and the output terminal.

According to other embodiments of the present invention, a scan driver includes a plurality of stage circuits each configured according to the stage circuit as described above are respectively coupled to scan lines in order to supply scan signals to the scan lines.

According to an embodiment of the present invention, a scan driver includes stage circuits respectively coupled to scan lines for supplying scan signals to the scan lines. Each of the stage circuits includes a progressive driver including a first transistor coupled between an output terminal and a fifth input terminal of the stage circuit, a gate electrode of the first transistor being coupled to a first node and a second transistor coupled between the output terminal and a first power source, a gate electrode of the second transistor being coupled to a second node; and a concurrent driver including an $11^{th}$ transistor coupled between a power source voltage and the output terminal, a gate electrode of the $11^{th}$ transistor being coupled to a third node, and a $12^{th}$ transistor coupled between the output terminal and the first power source, a gate electrode of the $12^{th}$ transistor being coupled to a third input terminal of the stage circuit. When the first transistor, the second transistor, the $11^{th}$ transistor, and the $12^{th}$ transistor are turned off, lower voltages than voltages applied to source electrodes are applied to the gate electrodes of the transistors.

The progressive driver may include a third transistor coupled between a seventh input terminal of the stage circuit and the first node, a gate electrode of the third transistor being coupled to the seventh input terminal; a fourth transistor coupled between the third transistor and the first node, a gate electrode of the fourth transistor being coupled to a first input terminal of the stage circuit; a fifth transistor coupled between the first node and a second power source, a gate electrode of the fifth transistor being coupled to a sixth input terminal of the stage circuit; a sixth transistor coupled between the second node and the second power source, a gate electrode of the sixth transistor being coupled to the first node; a seventh transistor coupled between the power source voltage and the second node, a gate electrode of the seventh transistor being coupled to a fourth input terminal of the stage circuit; an eighth transistor coupled between the first node and the second power source, a gate electrode of the eighth transistor being coupled to a third input terminal of the stage circuit; a ninth transistor coupled between the first node and the second power source in parallel with the eighth transistor, a gate electrode of the ninth transistor being coupled to a second input terminal of the stage circuit; a tenth transistor coupled between the second node and the second power source, a gate electrode of the tenth transistor being coupled to the second input terminal; a first capacitor coupled between the first node and the output terminal; a third capacitor coupled between the first node and the second power source; and a fourth capacitor coupled between the second node and the second power source.

The first input terminal of each of the stage circuits may be configured to receive a mode control signal. A second input terminal of each of the stage circuits may be configured to receive a first control signal. A third input terminal of each of the stage circuits may be configured to receive a second control signal. A sixth input terminal of each of the stage circuits may be configured to receive an output signal of a next stage. A seventh input terminal of each of the stage circuits may be configured to receive a start signal or an output signal of a previous stage. For an $i^{th}$ (i is a natural number) stage circuit, a previous stage may include an (i−1)th stage circuit, and a next stage may include an (i+2)th stage circuit. A fourth input terminal of each of $i^{th}$ is 1, 5, 9, ... ) stage circuits of the stage circuits may be configured to receive a first control clock signal, and a fifth input terminal of each of the $i^{th}$ (i is 1, 5, 9, ... ) stage circuits may be configured to receive a third clock signal. A fourth input terminal of each of (i+1)th stage circuits of the stage circuits may be configured to receive a second control clock signal, and a fifth input terminal of each of the (i+1)th stage circuits may be configured to receive a fourth clock signal. A fourth input terminal of each of (i+2)th stage circuits of the stage circuits may be configured to receive a third control clock signal, and a fifth input terminal of each of the (i+2)th stage circuits may be configured to receive a first clock signal. A fourth input terminal of each of (i+3)th stage circuits of the stage circuits may be configured to receive a fourth control clock signal, and a fifth input terminal of each of the (i+3)th stage circuits may be configured to receive a second clock signal.

In the stage circuit according to the embodiments of the present invention and the scan driver using the same, a lower voltage is applied to the gate electrode of each of the transistors than that applied to the source electrode of each of the transistors so that the transistors may be stably turned off. In addition, according to the embodiments of the present invention, the scan signals may be concurrently (e.g., simultaneously) or progressively supplied to the scan lines.

BRIEF DESCRIPTION OF THE DRAWINGS

The accompanying drawings, together with the specification, illustrate exemplary embodiments of the present invention, and, together with the description, serve to explain the principles of the present invention.

DETAILED DESCRIPTION OF THE EMBODIMENTS

Figure 1:
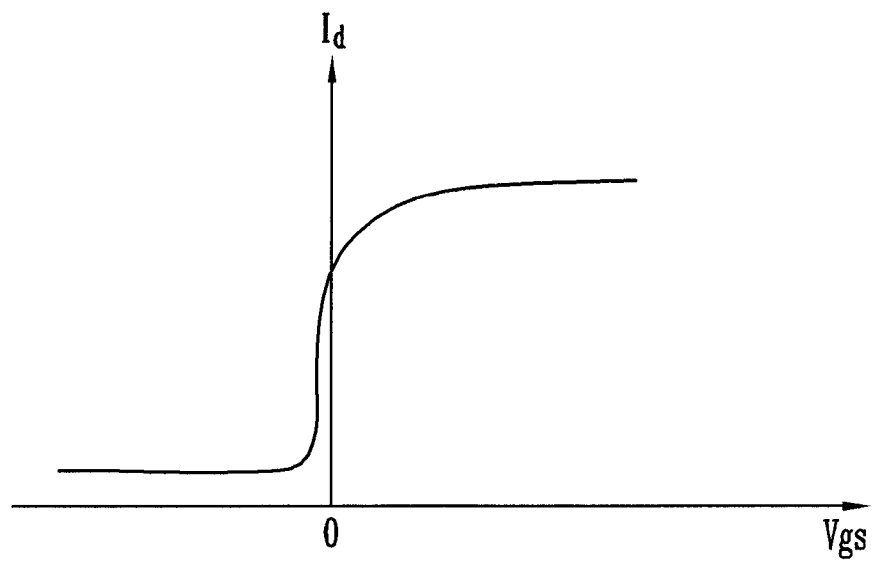
FIG. 1 is a drawing illustrating the characteristic of the threshold voltage of an N-type transistor.

Hereinafter, certain exemplary embodiments according to the present invention will be described with reference to the accompanying drawings. Here, when a first element is described as being coupled to a second element, the first element may be directly coupled to the second element or indirectly coupled to the second element via one or more third elements. Further, some of the elements that are not essential to the complete understanding of the invention are omitted for clarity. Also, like reference numerals refer to like elements throughout.

Hereinafter, exemplary embodiments by which those skilled in the art may easily perform the present invention will be described in detail with reference to FIGS. 2 to 11.

Figure 2:
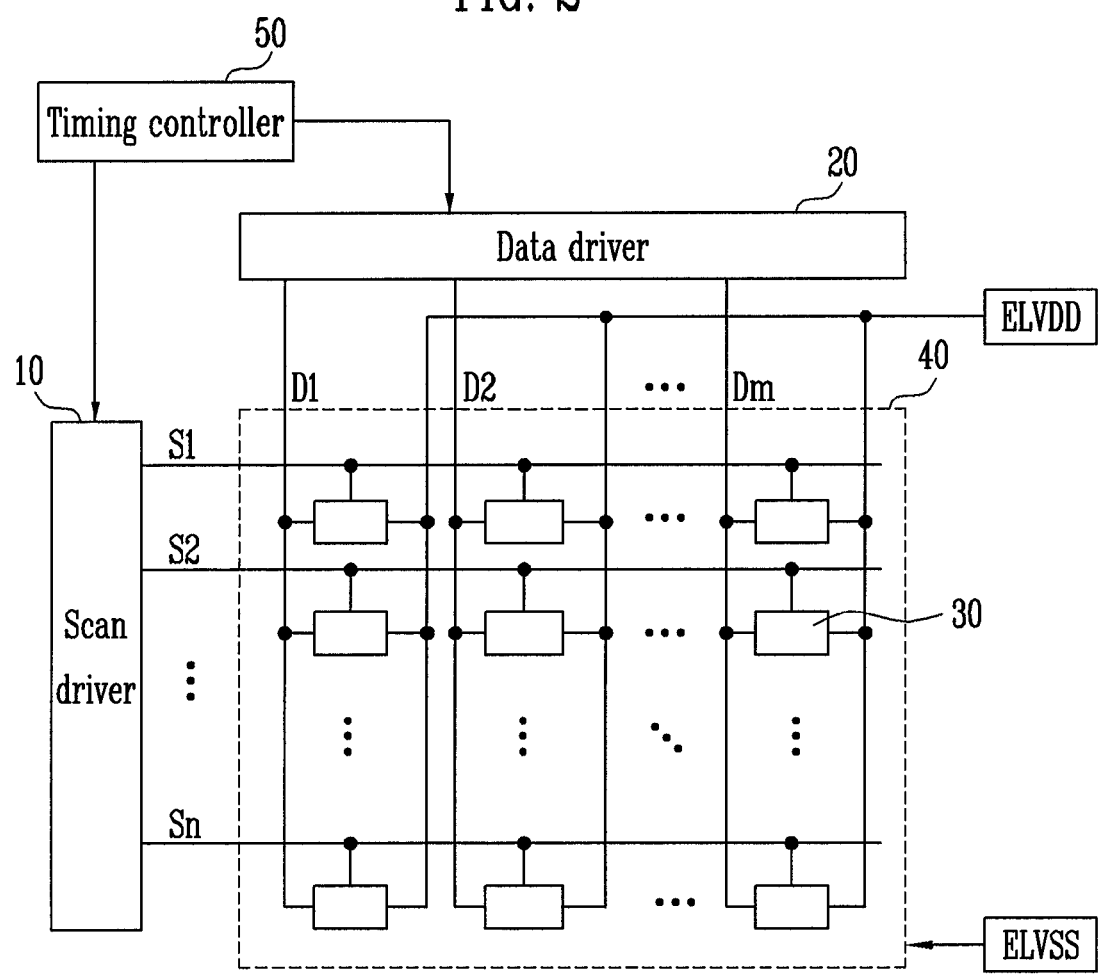
FIG. 2 is a block diagram illustrating an organic light emitting display according to an embodiment of the present invention.

FIG. 2 is a block diagram illustrating an organic light emitting display according to an embodiment of the present invention.

Referring to FIG. 2, the organic light emitting display according to the embodiment of the present invention includes a display unit 40 having pixels 30 positioned at the crossing regions between scan lines S1 to Sn and data lines D1 to Dm, a scan driver 10 for driving the scan lines S1 to Sn, a data driver 20 for driving the data lines D1 to Dm, and a timing controller 50 for controlling the scan driver 10 and the data driver 20.

The scan driver 10 supplies scan signals to the scan lines S1 to Sn. When the scan signals are supplied to the scan lines S1 to Sn, the pixels 30 are selected. Here, the scan driver 10 concurrently (e.g., simultaneously) or progressively supplies the scan signals to the scan lines S1 to Sn to correspond to a method of driving the scan driver 10. Therefore, the scan driver 10 includes stage circuits coupled to the scan lines S1 to Sn.

The data driver 20 supplies data signals to the data lines D1 to Dm in synchronization with the scan signals. Here, the data signals are supplied in synchronization with the progressively supplied scan signals.

The timing controller 50 supplies control signals for controlling the scan driver 10 and the data driver 20. In addition, the timing controller 50 supplies data from the outside to the data driver 20.

The pixels 30 store voltages corresponding to the data signals and generate light components with set or predetermined brightness while supplying currents corresponding to the stored voltages to organic light emitting diodes (not shown).

Figure 3:
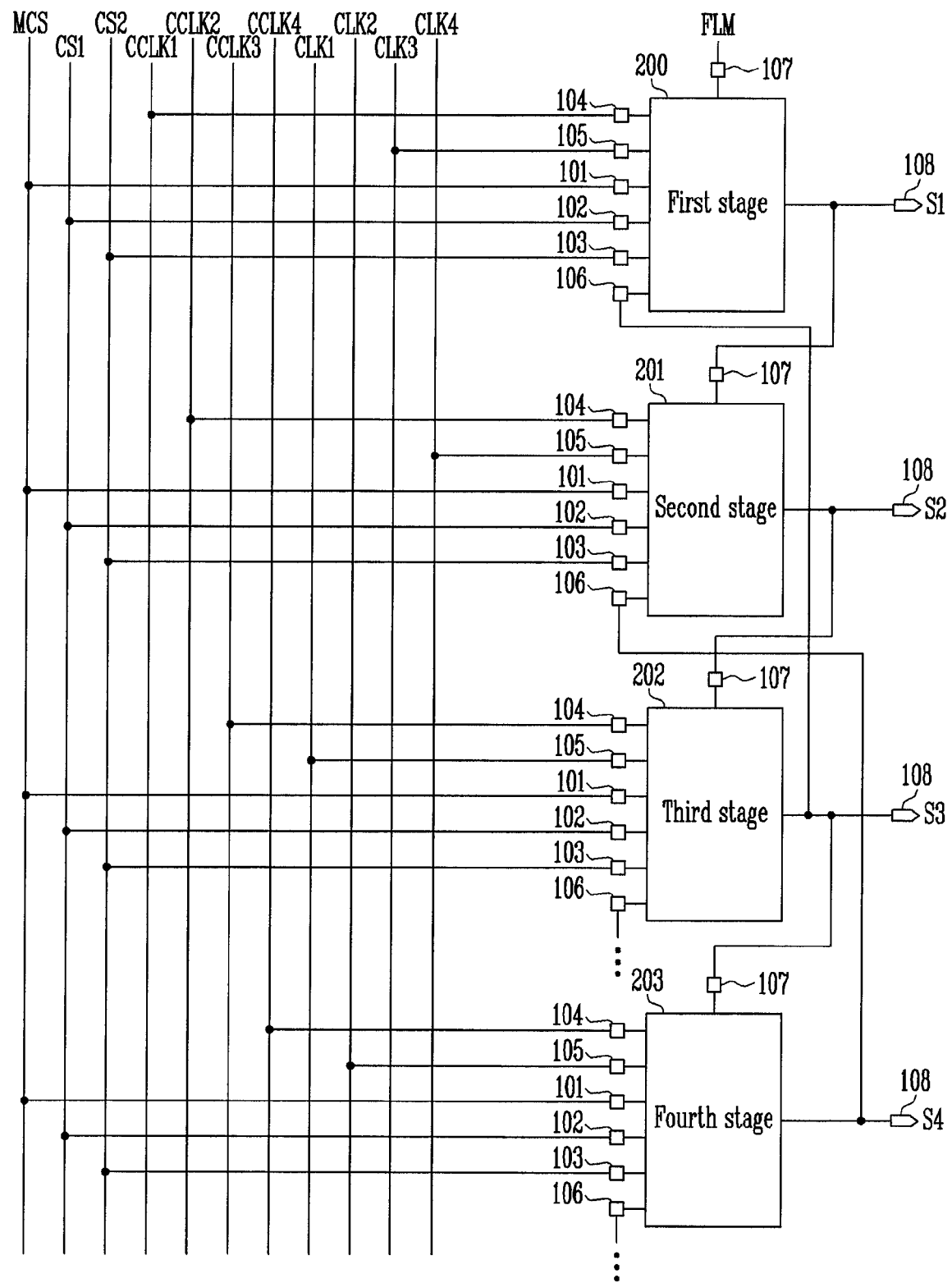
FIG. 3 is a block diagram illustrating an embodiment of stages included in the scan driver of FIG. 2.

FIG. 3 is a block diagram schematically illustrating the stages of the scan driver of FIG. 2. In FIG. 3, for convenience sake, four stages are illustrated. However, the present invention is not limited thereto.

Referring to FIG. 3, the scan driver 10 according to an embodiment of the present invention includes stages 200 to 203 respectively coupled to the scan lines S1 to S4. The stages 200 to 203 have the same circuit configuration and concurrently (e.g., simultaneously) or progressively output the scan signals.

Each of the stages 200 to 203 is coupled to one of the scan lines S1 to S4 and is driven by two clock signals (one of CCLK1 to CCLK4 and one of CLK1 to CLK4), and three control signals MCS, CS1, and CS2.

Each of the stages 200 to 203 includes a first input terminal 101, a second input terminal 102, a third input terminal 103, a fourth input terminal 104, a fifth input terminal 105, a sixth input terminal 106, a seventh input terminal 107, and an output terminal 108.

The fourth input terminal 104 included in each of $i^{th}$ (i is 1, 5, 9, ...) stages receives a first control clock signal CCLK1, and the fifth input terminal 105 receives a third clock signal CLK3. The fourth input terminal 104 included in each of $(i+1)^{th}$ stages receives a second control clock signal CCLK2, and the fifth input terminal 105 receives a fourth clock signal CLK4. The fourth input terminal 104 included in each of $(i+2)^{th}$ stages receives a third control clock signal CCLK3, and the fifth input terminal 105 receives a first clock signal CLK1. The fourth input terminal 104 included in each of $(i+3)^{th}$ stages receives a fourth control clock signal CCLK4, and the fifth input terminal 105 receives a second clock signal CLK2.

Figure 7:
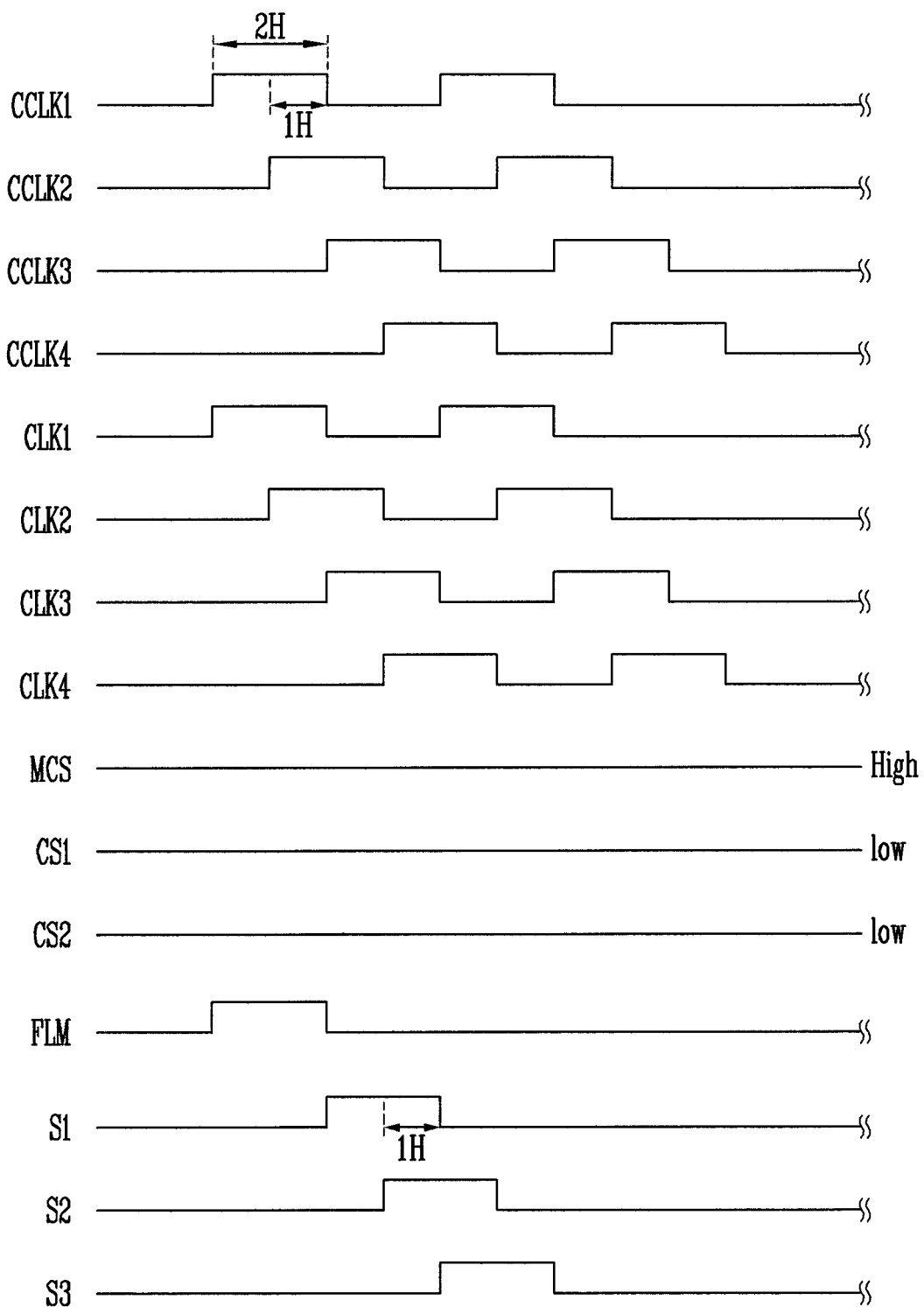
FIG. 7 is a drawing illustrating waveforms for progressively supplying the scan signals from the stage circuit of FIG. 4.

The phase of the control clock signal CCLK supplied to the fourth input terminal 104 of each of the stages does not overlap the phase of the clock signal CLK supplied to the fifth input terminal 105. Actually, as illustrated in FIG. 7, control clock signals CCLK (e.g., CCLK to CCLK 4) have the same period and are supplied so that the phases of the control clock signals CCLK overlap the phase of a previous control clock signal CCLK by 90 degrees. For example, the phase of the second control clock signal CCLK2 overlaps the phase of the first control clock signal CCLK1 by 90 degrees, and the phase of the third control clock signal CCLK3 overlaps the phase of the second control clock signal CCLK2 by 90 degrees. The phase of the fourth control clock signal CCLK4 overlaps the phase of the third control clock signal CCLK3 by 90 degrees.

Clock signals CLK (e.g., CLK 1 to CLK4) have the same period and are supplied so that the phases of the clock signals CLK overlap the phase of a previous clock signal CLK by 90 degrees. For example, the phase of the second clock signal CLK2 overlaps the phase of the first clock signal CLK1 by 90 degrees, and the phase of the third clock signal CLK3 overlaps the phase of the second clock signal CLK2 by 90 degrees. The phase of the fourth clock signal CLK4 overlaps the phase of the third clock signal CLK3 by 90 degrees. On the other hand, the control clock signals CCLK and the clock signals CLK have the same period.

The first input terminal 101 included in each of the stages 200 to 203 receives a mode control signal MCS, and the second input terminal 102 receives a first control signal CS1. The third input terminal 103 receives a second control signal CS2.

In addition, the sixth input terminal 106 included in each of the stages 200 to 203 receives an output signal of a next stage, and the seventh input terminal 107 receives an output signal (or a start signal FLM) of a previous stage.

In more detail, the sixth input terminal 106 included in each odd stage receives the output signal of a next odd stage, and the seventh input terminal 107 receives the output signal of a previous even stage. The sixth input terminal 106 included in each even stage receives the output signal of a next even stage, and the seventh input terminal 107 receives the output signal of a previous odd stage.

The seventh input terminal 107 of the first stage 200 receives the start signal FLM in synchronization with the first control clock signal CCLK1 supplied to the fourth input terminal 104.

Figure 4:
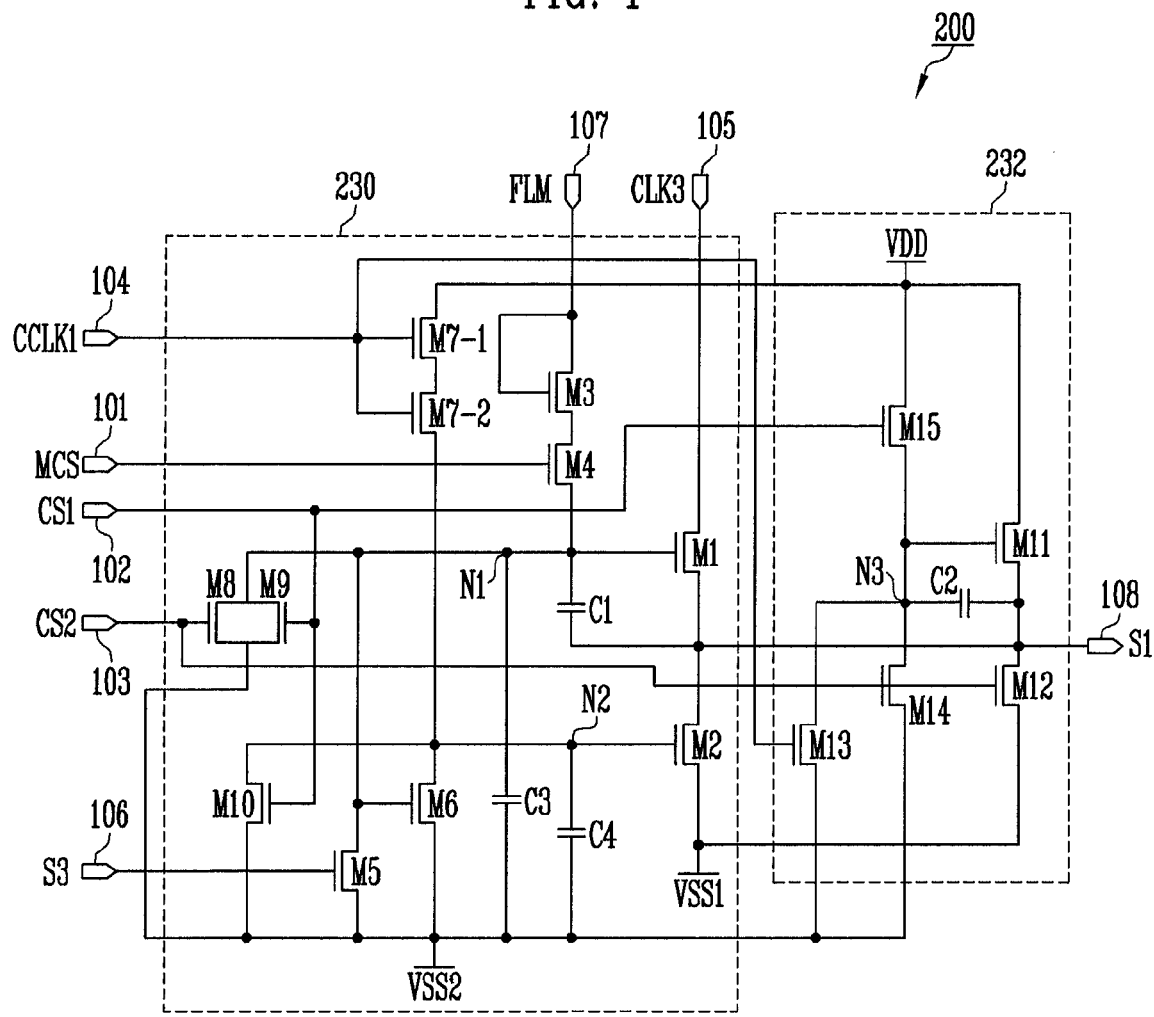
FIG. 4 is a circuit diagram schematically illustrating an embodiment of the stage circuit of FIG. 3.

FIG. 4 is a circuit diagram schematically illustrating an embodiment of the stage of FIG. 3. In FIG. 4, for convenience sake, the first stage 200 will be illustrated.

Referring to FIG. 4, the stage 200 according to the embodiment of the present invention includes a progressive driver 230 and a concurrent driver 232.

The progressive driver 230 outputs scan signals to correspond to the mode control signal MCS, the first control signal CS1, the second control signal CS2, the third clock signal CLK3, the first control clock signal CCLK1, the output signal S3 of a next stage, and the start signal FLM (or a previous stage output signal). The progressive driver 230 is used for progressively supplying the scan signals to the scan lines S1 to Sn.

On the other hand, the mode control signal MCS is used for selecting the progressive driver 230 or the concurrent driver 232. For example, the scan signals are generated by the progressive driver 230 when the mode control signal MCS is supplied (e.g., at a high voltage), and the scan signals are generated by the concurrent driver 232 when the mode control signal MCS is not supplied (e.g., at a low voltage).

The first control signal CS1 and the second control signal CS2 are used for controlling the supply of the scan signals from the concurrent driver 232. The first control signal CS1 and the second control signal CS2 are not supplied when the scan signals are generated by the progressive driver 230. The first control clock signal CCLK1 and the third clock signal CLK3 control the progressive driver 230 so that the scan signals are supplied from the progressive driver 230.

Figure 5:
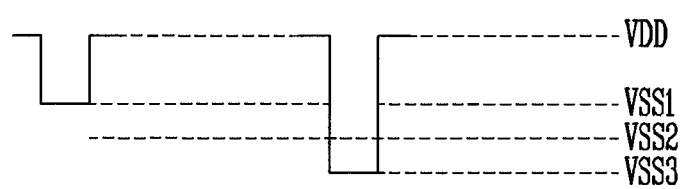
FIG. 5 is a drawing illustrating the magnitudes of the voltages of FIG. 4.

On the other hand, the clock signals CLK1 to CLK4 are supplied to the source or drain electrodes of the transistors, and the remaining signals (CCLK1 to CCLK4, MCS, CS1, and CS2) are supplied to the gate electrodes of the transistors. According to an embodiment of the present invention, as illustrated in FIG. 5, a voltage is set as the voltage of a power source voltage VDD when the clock signals CLK1 to CLK4 are supplied, and is set as the voltage of a first power source VSS1 when the clock signals CLK1 to CLK4 are not supplied so that the transistors may be stably turned off. The voltage is set as the power source voltage VDD when the remaining signals (CCLK1 to CCLK4, MCS, CS1, and CS2) are supplied, and is set as the voltage of a third power source VSS3 when the remaining signals (CCLK1 to CCLK4, MCS, CS1, and CS2) are not supplied.

Here, the voltage of the third power source VSS3 is set as a lower voltage than the voltage of the first power source VSS1. When the voltage supplied to the gate electrode of each of the transistors is set to be lower than the voltage supplied to the source electrode (or the drain electrode), the transistors may be stably turned off regardless of the movement of the threshold voltages of the transistors.

On the other hand, the second power source VSS2 is supplied to the source electrodes (or drain electrodes) and the gate electrodes of the transistors, and the first power source VSS1 is supplied to only the source electrodes (or drain electrodes) of the transistors. Therefore, the second power source VSS2 is set to have a lower voltage than that of the first power source VSS1. The third power source VSS3 is set to have a lower voltage than that of the second power source VSS2. According to an embodiment of the present invention, the voltage is set in the order of VDD>VSS1>VSS2>VSS3 and is set to have a difference of no less than the threshold voltage of each of the transistors. Additionally, the power source voltage VDD is set to have a voltage at which the N-type transistors may be turned on.

In order to progressively supply the scan signals, the progressive driver 230 includes first to tenth transistors M1 to M10, a first capacitor C1, a third capacitor C3, and a fourth capacitor C4.

The first transistor M1 is coupled between the fifth input terminal 105 and the output terminal 108. The gate electrode of the first transistor M1 is coupled to a first node N1. The first transistor M1 is turned on or off to correspond to the voltage applied to the first node N1. When the first transistor M1 is turned on, the fifth input terminal 105 and the output terminal 108 are electrically coupled to each other.

The second transistor M2 is coupled between the output terminal 108 and the first power source VSS1. The gate electrode of the second transistor M2 is coupled to a second node N2. The second transistor M2 is turned on or off to correspond to the voltage applied to the second node N2. When the second transistor M2 is turned on, the voltage of the first power source VSS1 is supplied to the output terminal 108.

The third transistor M3 is coupled between the fourth transistor M4 and the seventh input terminal 107. The gate electrode of the third transistor M3 is coupled to the seventh input terminal 107. The third transistor M3 is diode-coupled to be turned on when the start signal FLM is supplied to the seventh input terminal 107.

The fourth transistor M4 is coupled between the third transistor M3 and the first node N1. The gate electrode of the fourth transistor M4 is coupled to the first input terminal 101. The fourth transistor M4 is turned on when the mode control signal MCS is supplied to the first input terminal 101. When the fourth transistor M4 is turned on, the third transistor M3 and the first node N1 are electrically coupled to each other.

The fifth transistor M5 is coupled between the first node N1 and the second power source VSS2. The gate electrode of the fifth transistor M5 is coupled to the sixth input terminal 106. The fifth transistor M5 is turned on when the output signal of the next stage is supplied to the sixth input terminal 106 to supply the voltage of the second power source VSS2 to the first node N1.

The sixth transistor M6 is coupled between the second node N2 and the second power source VSS2. The gate electrode of the sixth transistor M6 is coupled to the first node N1. The sixth transistor M6 is turned on or off to correspond to the voltage of the first node N1. When the sixth transistor M6 is turned on, the voltage of the second power source VSS2 is supplied to the second node N2.

The seventh transistor M7 (e.g., M7-1 and M7-2) is coupled between the power source voltage VDD and the second node N2. The gate electrode of the seventh transistor M7 is coupled to the fourth input terminal 104. The seventh transistor M7 is turned on when the first control clock signal CCLK1 is supplied to the fourth input terminal 104. When the seventh transistor M7 is turned on, the second node N2 and the power source voltage VDD are electrically coupled to each other. In one embodiment, the seventh transistor M7 includes at least two serially coupled transistors M7_1 and M7_2. The seventh transistor M7 is formed to have higher resistance than that of the sixth transistor M6.

The eighth transistor M8 is coupled between the first node N1 and the second power source VSS2. The gate electrode of the eighth transistor M8 is coupled to the third input terminal 103. The eighth transistor M8 is turned on when the second control signal CS2 is supplied to the third input terminal 103. When the eighth transistor M8 is turned on, the voltage of the second power source VSS2 is supplied to the first node N1.

The ninth transistor M9 is coupled between the first node N1 and the second power source VSS2 in parallel with the eighth transistor M8. The gate electrode of the ninth transistor M9 is coupled to the second input terminal 102. The ninth transistor M9 is turned on when the first control signal CS1 is supplied to the second input terminal 102. When the ninth transistor M9 is turned on, the voltage of the second power source VSS2 is supplied to the first node N1.

The tenth transistor M10 is coupled between the second node N2 and the second power source VSS2. The gate electrode of the tenth transistor M10 is coupled to the second input terminal 102. The tenth transistor M10 is turned on when the first control signal CS1 is supplied to the second input terminal 102. When the tenth transistor M10 is turned on, the voltage of the second power source VSS2 is supplied to the second node N2.

The first capacitor C1 is coupled between the first node N1 and the output terminal 108. The first capacitor C1 is charged with the voltage corresponding to the turn-on or turn-off of the first transistor M1. In addition, the first capacitor C1 controls the voltage of the first node N1 to correspond to the voltage applied to the output terminal 108 when the first transistor M1 is turned on so that the first transistor M1 is stably turned on.

The third capacitor C3 is coupled between the first node N1 and the second power source VSS2. The third capacitor C3 stores the voltage applied to the first node N1 and stabilizes the voltage of the first node N1.

The fourth capacitor C4 is coupled between the second node N2 and the second power source VSS2. The fourth capacitor c4 stores the voltage applied to the second node and stabilizes the voltage of the second node N2.

The concurrent driver 232 outputs the scan signal to correspond to the first control signal CS1 and the second control signal CS2. The concurrent driver 232 is used to concurrently (e.g., simultaneously) supply the scan signals to the scan lines S1 to Sn. In one embodiment, the concurrent driver 232 includes $11^{th}$ to $15^{th}$ transistors M11 to M15 and a second capacitor C2.

The $11^{th}$ transistor M11 is coupled between the power source voltage VDD and the output terminal 108. The gate electrode of the $11^{th}$ transistor M11 is coupled to a third node N3. The $11^{th}$ transistor M11 is turned on or off to correspond to the voltage of the third node N3. When the $11^{th}$ transistor M11 is turned on, the power source voltage VDD is supplied to the output terminal 108.

The $12^{th}$ transistor M12 is coupled between the output terminal 108 and the first power source VSS1. The gate electrode of the $12^{th}$ transistor M12 is coupled to the third input terminal 103. The $12^{th}$ transistor M12 is turned on when the second control signal CS2 is supplied to the third input terminal 103. When the $12^{th}$ transistor M12 is turned on, the voltage of the first power source VSS1 is supplied to the output terminal 108.

The $13^{th}$ transistor M13 is coupled between the third node N3 and the second power source VSS2. The gate electrode of the $13^{th}$ transistor M13 is coupled to the fourth input terminal 104. The $13^{th}$ transistor M13 is turned on when the first control clock signal CCLK1 is supplied to the fourth input terminal 104. When the $13^{th}$ transistor M13 is turned on, the voltage of the second power source VSS2 is supplied to the third node N3.

The $14^{th}$ transistor M14 is coupled between the third node N3 and the second power source VSS2. The gate electrode of the $14^{th}$ transistor M14 is coupled to the third input terminal 103. The $14^{th}$ transistor M14 is turned on when the second control signal CS2 is supplied to the third input terminal 103. When the $14^{th}$ transistor M14 is turned on, the voltage of the second power source VSS2 is supplied to the third node N3.

The $15^{th}$ transistor M15 is coupled between the power source voltage VDD and the third node N3. The gate electrode of the $15^{th}$ transistor M15 is coupled to the second input terminal 102. The $15^{th}$ transistor M15 is turned on when the first control signal CS1 is supplied to the second input terminal 102. When the $15^{th}$ transistor M15 is turned on, the power source voltage VDD is supplied to the third node N3.

The second capacitor C2 is coupled between the third node N3 and the output terminal 108. The second capacitor C2 stores the voltage corresponding to the turn-on or turn-off state of the $11^{th}$ transistor M11. In addition, the second capacitor C2 controls the voltage of the third node N3 to correspond to the voltage of the output terminal 108 when the $11^{th}$ transistor M11 is turned on so that the $11^{th}$ transistor M11 stably maintains a turn-on state.

Figure 6:
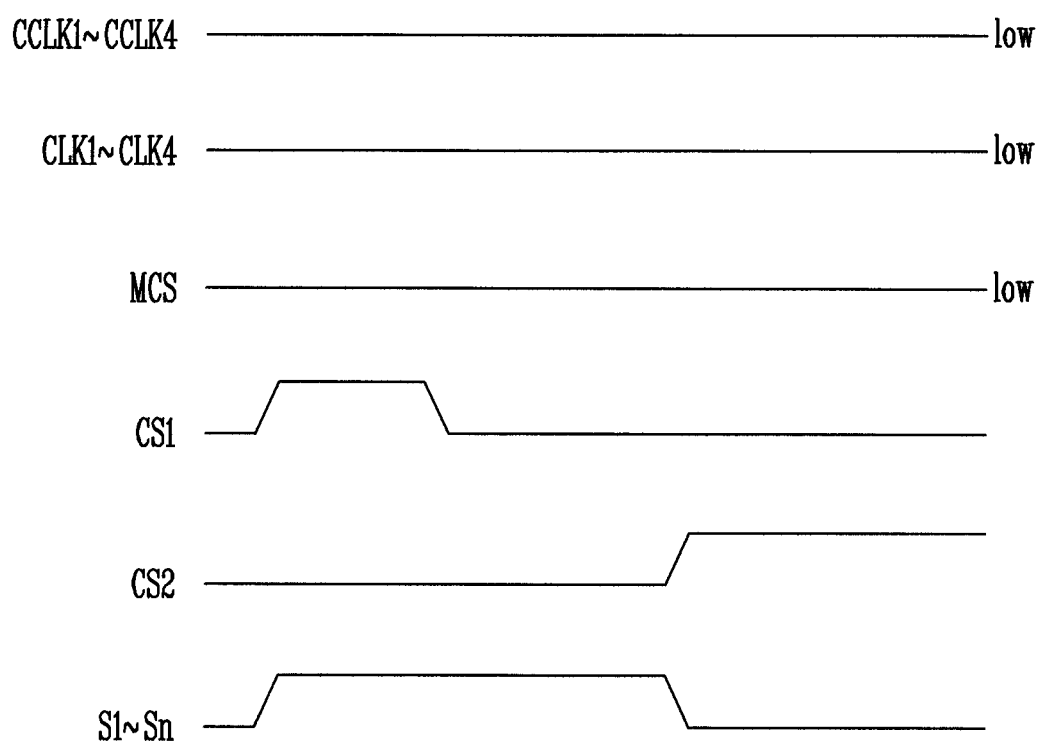
FIG. 6 is a drawing illustrating waveforms for concurrently (e.g., simultaneously) supplying scan signals from the stage circuit of FIG. 4.

FIG. 6 is a drawing illustrating a method of concurrently (e.g., simultaneously) outputting scan signals from the stage of FIG. 4.

Referring to FIG. 6, first, in the period where the concurrent driver 232 is driven, the clock signals CLK1 to CLK4 and the control clock signals CCLK1 to CCLK4 are not supplied. The mode control signal MCS is also not supplied (that is, in a low level).

When the mode control signal MCS is not supplied, the fourth transistor M4 is set in a turn-off state. In this case, the start signal FLM supplied to the seventh input terminal 107 or the output signal of a previous stage is not supplied to the first node N1.

Then, the first control signal CS1 is supplied. When the first control signal CS1 is supplied, the $15^{th}$ transistor M15, the ninth transistor M9, and the tenth transistor M10 are turned on.

When the ninth transistor M9 is turned on, the voltage of the second power source VSS2 is supplied to the first node N1. When the voltage of the second power source VSS2 is supplied to the first node N1, the first transistor M1 is set in a turn-off state. Since the voltage of the first power source VSS1 is supplied to the first electrode of the first transistor M1 (that is, the fifth input terminal 105), and the voltage of the second power source VSS2 is supplied to the gate electrode of the first transistor M1, the first transistor M1 stably maintains a turn-off state.

When the tenth transistor M10 is turned on, the voltage of the second power source VSS2 is supplied to the second node N2. When the voltage of the second power source VSS2 is supplied to the second node N2, the second transistor M2 is set in a turn-off state. Since the voltage of the second power source VSS2 is supplied to the gate electrode of the second transistor M2, and the voltage of the first power source VSS1 is supplied to the first electrode of the second transistor M2, the second transistor M2 stably maintains a turn-off state.

When the 15$^{th}$ transistor M15 is turned on, the power source voltage VDD is supplied to the third node N3. When the power source voltage VDD is supplied to the third node N3, the 11$^{th}$ transistor M11 is turned on. When the 11$^{th}$ transistor M11 is turned on, the power source voltage VDD is supplied to the output terminal 108 so that the scan signals are concurrently (e.g., simultaneously) supplied to the scan lines S1 to Sn. Here, the voltage corresponding to the turn-on state of the 11$^{th}$ transistor M11 is charged in the second capacitor C2 so that the 11$^{th}$ transistor M11 is set in a turn-on state although the supply of the first control signal CS1 is stopped.

On the other hand, in the period where the first control signal CS1 is supplied, the second control signal CS2 is not supplied. When the second control signal CS2 is not supplied, the 12$^{th}$ transistor M12 is set in a turn-off state so that the power source voltage VDD may be stably supplied to the output terminal 108. Here, since the voltage of the third power source VSS3 is supplied to the gate electrode of the 12$^{th}$ transistor M12, and the voltage of the first power source VSS1 is supplied to the first electrode, the 12$^{th}$ transistor M12 stably maintains a turn-off state.

Then, the second control signal CS2 is supplied so that the eighth transistor M8, the 12$^{th}$ transistor M12, and the 14$^{th}$ transistor M14 are turned on.

When the eighth transistor M8 is turned on, the voltage of the second power source VSS2 is supplied to the first node N1 so that the first transistor M1 maintains a turn-off state.

When the 14$^{th}$ transistor M14 is turned on, the voltage of the second power source VSS2 is supplied to the third node N3. When the voltage of the second power source VSS2 is supplied to the third node N3, the 11$^{th}$ transistor M11 is turned off. Here, since the voltage of the second power source VSS2 is supplied to the gate electrode of the 11$^{th}$ transistor M11, and the voltage of the first power source VSS1 is supplied to the first electrode of the 11$^{th}$ transistor M11, the 11$^{th}$ transistor M11 stably maintains a turn-off state.

When the 12$^{th}$ transistor M12 is turned on, the voltage of the first power source VSS1 is supplied to the output terminal 108. That is, when the 12$^{th}$ transistor M12 is turned on, the supply of a scan signal to the output terminal 108 is stopped.

As described above, according to an embodiment of the present invention, the scan signals may be concurrently (e.g., simultaneously) supplied to the scan lines S1 to Sn, or the supply of the scan signals may be concurrently (e.g., simultaneously) stopped using the first control signal CS1 and the second control signal CS2.

FIG. 7 is a drawing illustrating a method of progressively outputting the scan signals from the stage of FIG. 4.

Referring to FIG. 7, in the period where the progressive driver 230 is driven, the mode control signal MCS is supplied, and the first control signal CS1 and the second control signal CS2 are not supplied.

When the mode control signal MCS is supplied, the fourth transistor M4 is turned on. When the fourth transistor M4 is turned on, the voltage of the first node N1 is controlled to correspond to the start signal FLM that is supplied to the seventh input terminal 107.

Since the first control signal CS1 and the second control signal CS2 are not supplied, in the period where the progressive driver 230 is driven, the eighth transistor M8, the ninth transistor M9, the tenth transistor M10, the 12$^{th}$ transistor M12, the 14$^{th}$ transistor M14, and the 15$^{th}$ transistor M15 are set in a turn-off state.

Then, the first control clock signal CCLK1 is supplied to the fourth input terminal 104, and the start signal FLM is supplied to the seventh input terminal 107.

When the start signal FLM is input, the third transistor M3 is turned on so that the voltage (for example, VDD) of the start signal FLM is applied to the first node N1. When the voltage of the start signal FLM is applied to the first node N1, the first transistor M1 and the sixth transistor M6 are turned on.

When the first transistor M1 is turned on, the fifth input terminal 105 and the output terminal 108 are electrically coupled to each other. Here, since the third clock signal CLK3 is not supplied, the scan signal is not supplied to the output terminal 108. On the other hand, when the first transistor M1 is turned on, the voltage corresponding to the turn-on state of the first transistor M1 is stored in the first capacitor C1.

When the sixth transistor M6 is turned on, the voltage of the second power source VSS2 is supplied to the second node N2. When the voltage of the second power source VSS2 is supplied to the second node N2, the second transistor M2 is turned off. When the second transistor M2 is turned off, the output terminal 108 and the fifth input terminal 105 stably maintain electrical coupling.

When the first control clock signal CCLK1 is supplied, the seventh transistor M7 and the 13$^{th}$ transistor M13 are turned on. When the seventh transistor M7 is turned on, the second node N2 and the power source voltage VDD are electrically coupled to each other. Here, the second node N2 is coupled to the second power source VSS2 via the sixth transistor M6 and is coupled to the power source voltage VDD via the seventh transistor M7.

Since the seventh transistor M7 includes a plurality of serially coupled transistors (e.g., M7-1 and M7-2), the voltage of the second node N2 is set to be similar to the voltage of the second power source VSS2 so that the second transistor M2 maintains a turn-off state.

When the 13$^{th}$ transistor M13 is turned on, the voltage of the second power source VSS2 is supplied to the third node N3. When the voltage of the second power source VSS2 is supplied to the third node N3, the 11$^{th}$ transistor M11 is turned off. Here, since the second power source VSS2 is supplied to the gate electrode of the 11$^{th}$ transistor M11, and the voltage of the first power source VSS1 (that is, the voltage of the fifth input terminal 105) is supplied to the output terminal 108, the 11$^{th}$ transistor M11 stably maintains a turn-off state.

Then, as the supply of the first control clock signal CCLK1 is stopped, the third clock signal CLK3 is supplied to the fifth input terminal 105.

When the supply of the first control clock signal CCLK1 is stopped, the seventh transistor M7 and the 13$^{th}$ transistor M13 are turned off. When the seventh transistor M7 is turned off, electrical coupling between the second node N2 and the power source voltage VDD is blocked. In this case, the voltage of the second node N2 is reduced to the voltage of the second power source VSS2 so that the second transistor M2 is stably turned off without leakage current.

When the 13$^{th}$ transistor M13 is turned off, electrical coupling between the third node N3 and the second power source VSS2 is blocked. At this time, the 11$^{th}$ transistor M11 stably maintains a turn-off state to correspond to the voltage charged in the second capacitor C2.

The third clock signal CLK3 supplied to the fifth input terminal 105 is supplied to the output terminal 108 via the first transistor M1. The third clock signal CLK3 supplied to the output terminal 108 as a scan signal is supplied to the scan line S1. On the other hand, when the third clock signal CLK3 is supplied to the output terminal 108, due to the coupling of the first capacitor C1, the voltage of the first node N1 increases so that the first transistor M1 stably maintains a turn-on state.

After the scan signal is supplied to the output terminal 108, the output signal of the next stage (that is, a third stage S3) is supplied to the sixth input terminal 106, and the first control clock signal CCLK1 is supplied to the fourth input terminal 104.

When the output signal of the next stage is supplied to the sixth input terminal 106, the fifth transistor M5 is turned on. When the fifth transistor M5 is turned on, the voltage of the second power source VSS2 is supplied to the first node N1. When the voltage of the second power source VSS2 is supplied to the first node N1, the first transistor M1 is turned off, and the sixth transistor M6 is turned off. Here, the voltage corresponding to the turn-off state of the first transistor M1 is charged in the first capacitor C1. On the other hand, since the second power source VSS2 is supplied to the gate electrode of the first transistor M1, the first transistor M1 stably maintains a turn-off state.

When the first control clock signal CCLK1 is supplied, the seventh transistor M7 and the 13$^{th}$ transistor M13 are turned on. When the seventh transistor M7 is turned on, the power source voltage VDD is supplied to the second node N2. When the power source voltage VDD is supplied to the second node N2, the second transistor M2 is turned on. When the second transistor M2 is turned on, the supply of the voltage of the first power source VSS1 is supplied to the output terminal 108, that is, the scan signal to the output terminal 108 is stopped. At this time, the voltage applied to the second node N2 is stored in the fourth capacitor C4.

When the 13$^{th}$ transistor M13 is turned on, the voltage of the second power source VSS2 is supplied to the third node N3 so that the 11$^{th}$ transistor M11 maintains a turn-off state. Then, the stage 200 maintains the turn-on state of the second transistor M2 before a next start signal FLM is supplied.

On the other hand, the second stage 201 receives the output signal of the first stage 200 that is supplied to partially overlap the second control clock signal CCLK2 to output a scan signal to the second scan line S2 in synchronization with the fourth clock signal CLK4.

The output signal of the second stage 201 that is supplied to partially overlap the third control clock signal CCLK3 is received so that a scan signal is output to the third scan line S3 in synchronization with the first clock signal CLK1.

In this case, the scan signals are progressively output to the scan lines S1 to Sn, and each of the scan signals is supplied to overlap a previous scan signal in a set or predetermined period. For example, as illustrated in FIG. 7, a scan signal is set to have a width or a period of 2H and may overlap a previous scan signal in a period of 1H.

According to the above-described embodiment of the present invention, in order to be applied to a specific driving method, the scan signal supplied to a previous scan line and the scan signal supplied to the current scan line partially overlap. However, the present invention is not limited to the above embodiment. That is, the scan signals supplied to the scan lines S1 to Sn may be supplied without overlapping each other.

In another embodiment, when the clock control signals CCLK1 to CCLK4 and clock signals CLK1 to CLK4 do not overlap each other, the scan signals supplied to the scan lines S1 to Sn do not overlap. In this case, the scan driver 10 may be driven using two control clock signals and two clock signals. As described above, the present invention may be applied to various driving methods by controlling the coupling method of the stages.

Figure 8:
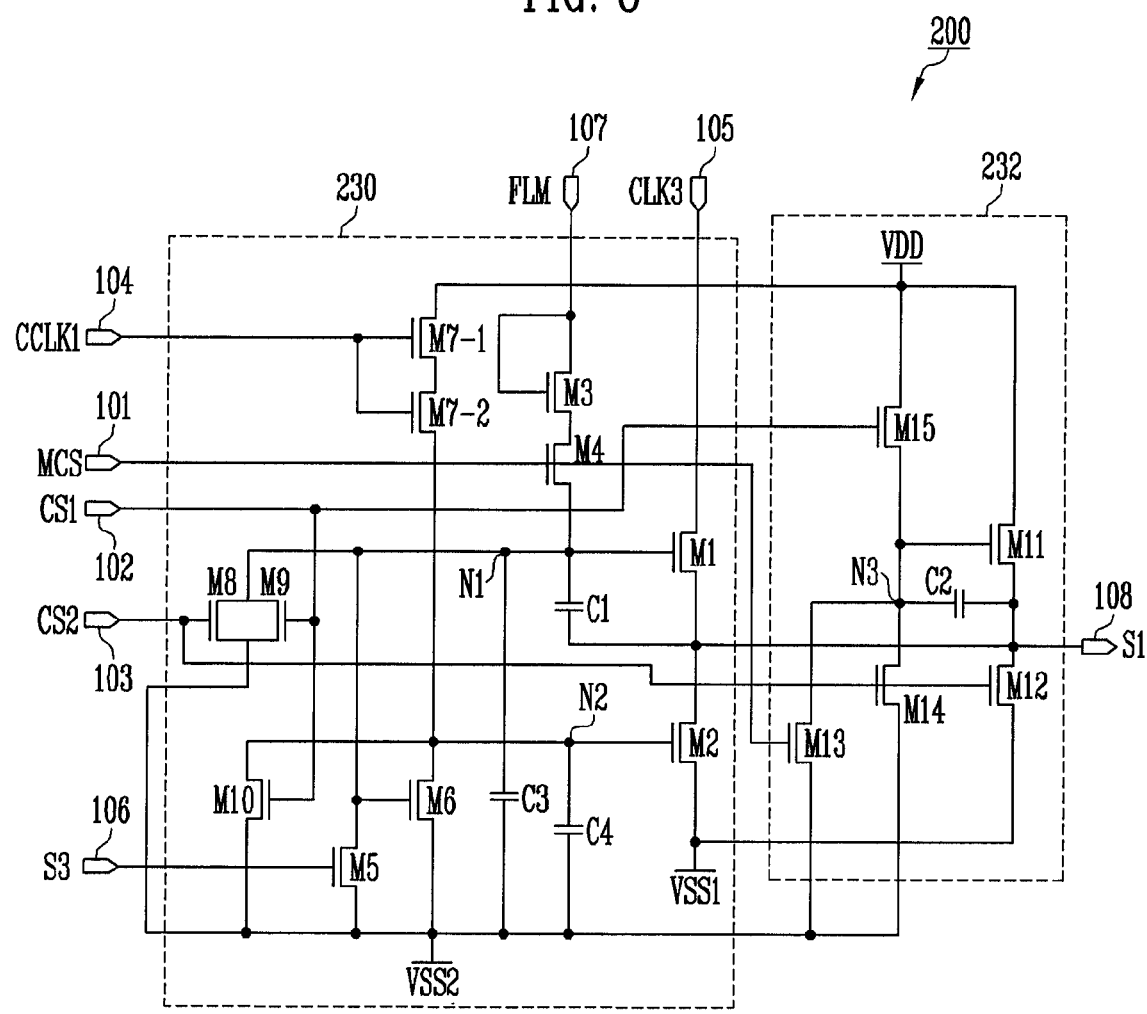
FIG. 8 is a circuit diagram schematically illustrating another embodiment of the stage circuit of FIG. 3.

FIG. 8 is a circuit diagram schematically illustrating another embodiment of the stage of FIG. 3. In describing FIG. 8, description of the same structures as those of FIG. 4 will be omitted.

Referring to FIG. 8, the gate electrode of the 13$^{th}$ transistor M13 of the stage 200 according to another embodiment of the present invention is coupled to the first input terminal 101. In this case, the 13$^{th}$ transistor M13 sets the 11$^{th}$ transistor M11 in a turn-off state while maintaining a turn-on state in the period where the mode control signal MCS is supplied (that is, in the period where the scan signals are progressively supplied). The 13$^{th}$ transistor M13 is set in a turn-off state in the period where the mode control signal MCS is not supplied (that is, in the period where the scan signals are concurrently or simultaneously supplied).

Since the other structures and operation processes are substantially the same as those of the stage circuit illustrated in FIG. 4, description thereof will be omitted.

Figure 9:
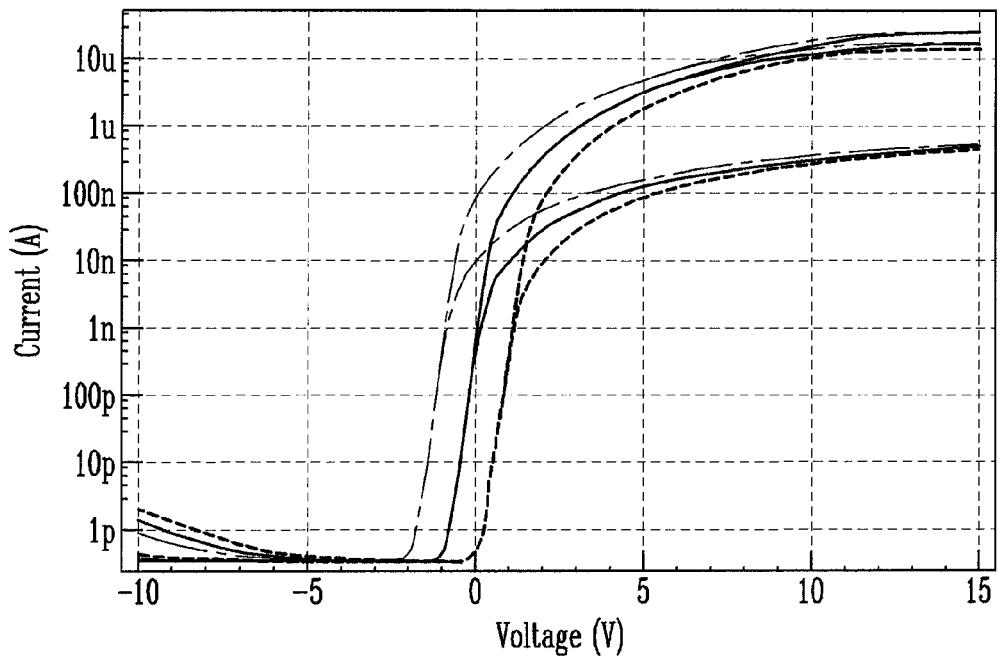
FIG. 9 is a drawing illustrating the characteristic curves corresponding to changes in the threshold voltages of N-type transistors.

FIG. 9 is a drawing illustrating the movement characteristics of the threshold voltages of NMOS transistors.

Referring to FIG. 9, when the threshold voltages of the NMOS transistors move or change, although the voltage of Vgs=0V is applied, a corresponding or predetermined current flows.

According to the embodiments of the present invention, in order to prevent such leakage current, since a low voltage (for example, Vgs=-2V) is applied to the gate electrodes of the transistors, regardless of the movements of the threshold voltages of the NMOS transistors, the transistors may be stably turned off.

Figure 10:
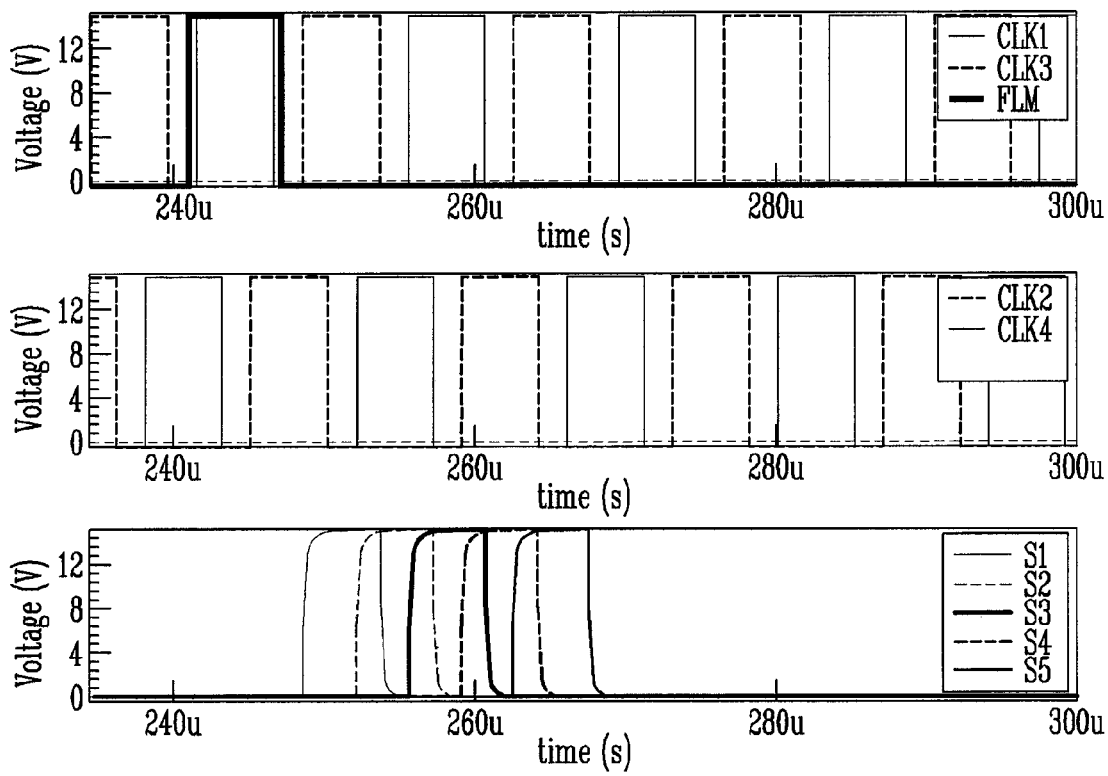
FIG. 10 is a simulation waveform chart illustrating processes of progressively outputting the scan signals from the scan driver according to an embodiment of the present invention.

FIG. 10 is a simulation waveform chart illustrating processes of progressively outputting the scan signals from the scan driver according to an embodiment of the present invention.

Referring to FIG. 10, the scan driver 10 according to an embodiment of the present invention progressively outputs the scan signals to the scan lines S1 to S5 to correspond to the start signal FLM. In particular, according to this embodiment of the present invention, since the transistors are stably turned off, reliability of driving may be secured.

Figure 11:
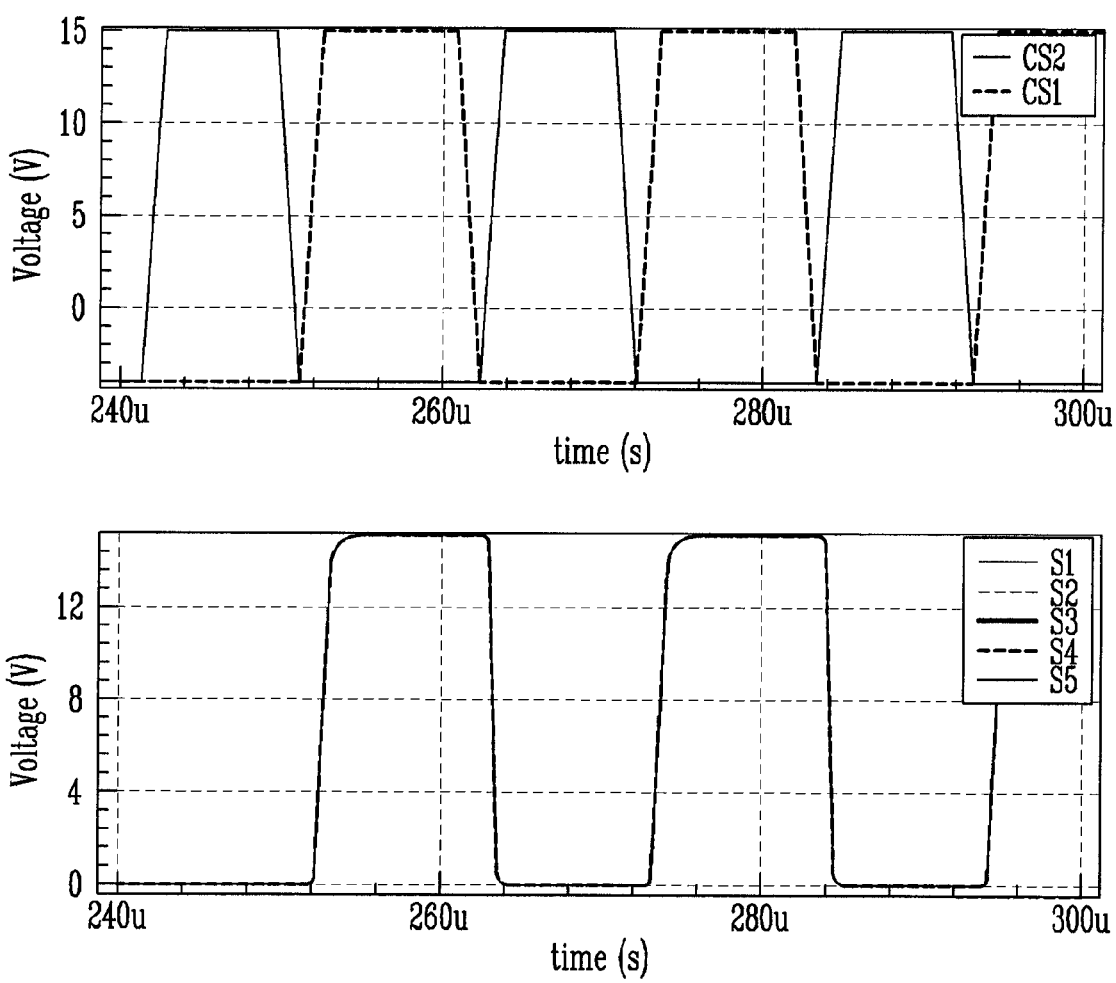
FIG. 11 is a simulation waveform chart illustrating processes of concurrently (e.g., simultaneously) outputting the scan signals from the scan driver according to an embodiment of the present invention.

FIG. 11 is a simulation waveform chart illustrating processes of concurrently (e.g., simultaneously) outputting the scan signals from the scan driver according to an embodiment of the present invention.

Referring to FIG. 11, the scan driver 10 according to this embodiment of the present invention concurrently (e.g., simultaneously) outputs the scan signals to the scan lines S1 to S5 to correspond to the first control signal CS1 and the second control signal CS2. In particular, according to this embodiment of the present invention, since the transistors are stably turned off, the reliability of driving may be secured.

While the present invention has been described in connection with certain exemplary embodiments, it is to be understood that the invention is not limited to the disclosed embodiments, but, on the contrary, is intended to cover various modifications and equivalent arrangements included within the spirit and scope of the appended claims, and equivalents thereof.

What is claimed is:

1. A stage circuit comprising:
 a progressive driver comprising a first transistor coupled between an output terminal and a fifth input terminal of the stage circuit, a gate electrode of the first transistor being coupled to a first node, and a second transistor coupled between the output terminal and a first power source, a gate electrode of the second transistor being coupled to a second node; and a concurrent driver comprising an 11$^{th}$ transistor coupled between a power source voltage and the output terminal, a gate electrode of the 11$^{th}$ transistor being coupled to a third node, and a 12$^{th}$ transistor coupled between the output terminal and the first power source, a gate electrode of the 12$^{th}$ transistor being coupled to a third input terminal of the stage circuit, wherein, when the first transistor, the second transistor, the 11$^{th}$ transistor, and the 12$^{th}$ transistor are turned off, lower voltages than voltages applied to source electrodes are applied to the gate electrodes of the transistors.

2. The stage circuit as claimed in claim 1, wherein the progressive driver comprises:
- a third transistor coupled between a seventh input terminal of the stage circuit and the first node, a gate electrode of the third transistor being coupled to the seventh input terminal;
- a fourth transistor coupled between the third transistor and the first node, a gate electrode of the fourth transistor being coupled to a first input terminal of the stage circuit;
- a fifth transistor coupled between the first node and a second power source, a gate electrode of the fifth transistor being coupled to a sixth input terminal of the stage circuit;
- a sixth transistor coupled between the second node and the second power source, a gate electrode of the sixth transistor being coupled to the first node;
- a seventh transistor coupled between the power source voltage and the second node, a gate electrode of the seventh transistor being coupled to a fourth input terminal of the stage circuit;
- an eighth transistor coupled between the first node and the second power source, a gate electrode of the eighth transistor being coupled to the third input terminal of the stage circuit;
- a ninth transistor coupled between the first node and the second power source in parallel with the eighth transistor, a gate electrode of the ninth transistor being coupled to a second input terminal of the stage circuit; and
- a tenth transistor coupled between the second node and the second power source, a gate electrode of the tenth transistor being coupled to the second input terminal.

3. The stage circuit as claimed in claim 2, further comprising:
- a first capacitor coupled between the first node and the output terminal;
- a third capacitor coupled between the first node and the second power source; and
- a fourth capacitor coupled between the second node and the second power source.

4. The stage circuit as claimed in claim 2, wherein the seventh transistor comprises at least two serially coupled transistors.

5. The stage circuit as claimed in claim 2,
wherein the power source voltage is set to have a higher voltage than that of the first power source, and
wherein the first power source is set to have a higher voltage than that of the second power source.

6. The stage circuit as claimed in claim 5,
wherein the first input terminal is configured to receive a mode control signal,
wherein the second input terminal of the stage circuit is configured to receive a first control signal,
wherein the third input terminal of the stage circuit is configured to receive a second control signal,
wherein the fourth input terminal of the stage circuit is configured to receive a control clock signal,
wherein the fifth input terminal of the stage circuit is configured to receive a clock signal,
wherein the sixth input terminal of the stage circuit is configured to receive an output signal of a next stage, and
wherein the seventh input terminal of the stage circuit is configured to receive a start signal or an output signal of a previous stage.

7. The stage circuit as claimed in claim 6, wherein the clock signal swings between the power source voltage and the voltage of the first power source.

8. The stage circuit as claimed in claim 6, wherein the mode control signal, the control clock signal, the first control signal, and the second control signal swing between the power source voltage and a voltage of a third power source that is lower than a voltage of the second power source.

9. The stage circuit as claimed in claim 8, wherein a voltage difference between any two voltages of the power source voltage, the first power source, the second power source, and the third power source is no less than threshold voltages of the transistors.

10. The stage circuit as claimed in claim 6, wherein the control clock signal does not overlap the clock signal.

11. The stage circuit as claimed in claim 6, wherein the start signal or the output signal of the previous stage is supplied to overlap the control clock signal.

12. The stage circuit as claimed in claim 6, wherein the mode control signal is set in a high level so that the fourth transistor is turned on when a scan signal is supplied from the progressive driver, and is set in a low level when a scan signal is supplied from the concurrent driver.

13. The stage circuit as claimed in claim 6,
wherein the first control signal and the second control signal are set in a low level when a scan signal is supplied from the progressive driver, and are set in a high level not to overlap each other when a scan signal is supplied from the concurrent driver.

14. The stage circuit as claimed in claim 13, wherein, when the scan signal is supplied from the concurrent driver, the second control signal is supplied after the first control signal is supplied.

15. The stage circuit as claimed in claim 2, wherein the concurrent driver comprises:
- a 13$^{th}$ transistor coupled between the third node and the second power source, a gate electrode of the 13$^{th}$ transistor being coupled to the fourth input terminal;
- a 14$^{th}$ transistor coupled between the third node and the second power source, a gate electrode of the 14$^{th}$ transistor being coupled to the third input terminal;
- a 15$^{th}$ transistor coupled between the power source voltage and the third node, a gate electrode of the 15$^{th}$ transistor being coupled to the second input terminal; and
- a second capacitor coupled between the third node and the output terminal.

16. The stage circuit as claimed in claim 2, wherein the concurrent driver comprises:
- a 13$^{th}$ transistor coupled between the third node and the second power source, a gate electrode of the 13$^{th}$ transistor being coupled to the first input terminal;
- a 14$^{th}$ transistor coupled between the third node and the second power source, a gate electrode of the 14$^{th}$ transistor being coupled to the third input terminal;
- a 15$^{th}$ transistor coupled between the power source voltage and the third node, a gate electrode of the 15$^{th}$ transistor being coupled to the second input terminal; and a second capacitor coupled between the third node and the output terminal.

17. A scan driver comprising the stage circuit as claimed in claim 1 to be coupled to scan lines in order to supply scan signals to the scan lines.

18. A scan driver comprising stage circuits respectively coupled to scan lines for supplying scan signals to the scan lines,
wherein each of the stage circuits comprises:
a progressive driver comprising a first transistor coupled between an output terminal and a fifth input terminal of the stage circuit, a gate electrode of the first transistor being coupled to a first node, and a second transistor coupled between the output terminal and a first power source, a gate electrode of the second transistor being coupled to a second node; and
a concurrent driver comprising an $11^{th}$ transistor coupled between a power source voltage and the output terminal, a gate electrode of the $11^{th}$ transistor being coupled to a third node, and a $12^{th}$ transistor coupled between the output terminal and the first power source, a gate electrode of the $12^{th}$ transistor being coupled to a third input terminal of the stage circuit, and
wherein, when the first transistor, the second transistor, the $11^{th}$ transistor, and the $12^{th}$ transistor are turned off, lower voltages than voltages applied to source electrodes are applied to the gate electrodes of the transistors.

19. The scan driver as claimed in claim 18, wherein the progressive driver comprises:
a third transistor coupled between a seventh input terminal of the stage circuit and the first node, a gate electrode of the third transistor being coupled to the seventh input terminal;
a fourth transistor coupled between the third transistor and the first node, a gate electrode of the fourth transistor being coupled to a first input terminal of the stage circuit;
a fifth transistor coupled between the first node and a second power source, a gate electrode of the fifth transistor being coupled to a sixth input terminal of the stage circuit;
a sixth transistor coupled between the second node and the second power source, a gate electrode of the sixth transistor being coupled to the first node;
a seventh transistor coupled between the power source voltage and the second node, a gate electrode of the seventh transistor being coupled to a fourth input terminal of the stage circuit;
an eighth transistor coupled between the first node and the second power source, a gate electrode of the eighth transistor being coupled to the third input terminal of the stage circuit;
a ninth transistor coupled between the first node and the second power source in parallel with the eighth transistor, a gate electrode of the ninth transistor being coupled to a second input terminal of the stage circuit;
a tenth transistor coupled between the second node and the second power source, a gate electrode of the tenth transistor being coupled to the second input terminal;
a first capacitor coupled between the first node and the output terminal;
a third capacitor coupled between the first node and the second power source; and
a fourth capacitor coupled between the second node and the second power source.

20. The scan driver as claimed in claim 19,
wherein the first input terminal of each of the stage circuits is configured to receive a mode control signal,
wherein the second input terminal of each of the stage circuits is configured to receive a first control signal,
wherein the third input terminal of each of the stage circuits is configured to receive a second control signal,
wherein the sixth input terminal of each of the stage circuits is configured to receive an output signal of a next stage, and
wherein the seventh input terminal of each of the stage circuits is configured to receive a start signal or an output signal of a previous stage.

21. The scan driver as claimed in claim 20,
wherein, for an $i^{th}$ (i is a natural number) stage circuit, the previous stage comprises an (i−1)th stage circuit, and
wherein a next stage comprises an (i+2)th stage circuit.

22. The scan driver as claimed in claim 19,
wherein the fourth input terminal of each of $i^{th}$ (i is 1, 5, 9, ...) stage circuits of the stage circuits is configured to receive a first control clock signal, and the fifth input terminal of each of the $i^{th}$ (i is 1, 5, 9, ...) stage circuits is configured to receive a third clock signal,
wherein the fourth input terminal of each of (i+1)th stage circuits of the stage circuits is configured to receive a second control clock signal, and the fifth input terminal of each of the (i+1)th stage circuits is configured to receive a fourth clock signal,
wherein the fourth input terminal of each of (i+2)th stage circuits of the stage circuits is configured to receive a third control clock signal, and the fifth input terminal of each of the (i+2)th stage circuits is configured to receive a first clock signal, and
wherein the fourth input terminal of each of (i+3)th stage circuits of the stage circuits is configured to receive a fourth control clock signal, and the fifth input terminal of each of the (i+3)th stage circuits is configured to receive a second clock signal.

23. The scan driver as claimed in claim 22,
wherein j-th (j is 1, 2, 3, and 4) control clock signals have the same periods as j-th clock signals, and
wherein phases of the j-th control clock signals overlap phases of the j-th clock signals.

24. The scan driver as claimed in claim 22, wherein the control clock signals are progressively supplied so that phases overlap by 90 degrees.

25. The scan driver as claimed in claim 22, wherein the clock signals are progressively supplied so that phases overlap by 90 degrees.

26. The scan driver as claimed in claim 19, wherein the concurrent driver comprises:
a $13^{th}$ transistor coupled between the third node and the second power source, a gate electrode of the $13^{th}$ transistor being coupled to the fourth input terminal;
a $14^{th}$ transistor coupled between the third node and the second power source, a gate electrode of the $14^{th}$ transistor being coupled to the third input terminal;
a $15^{th}$ transistor coupled between the power source voltage and the third node, a gate electrode of the $15^{th}$ transistor being coupled to the second input terminal; and
a second capacitor coupled between the third node and the output terminal.

27. The scan driver as claimed in claim 19, wherein the concurrent driver comprises:
a $13^{th}$ transistor coupled between the third node and the second power source, a gate electrode of the $13^{th}$ transistor being coupled to the first input terminal;

a 14$^{th}$ transistor coupled between the third node and the second power source, a gate electrode of the 14$^{th}$ transistor being coupled to the third input terminal;

a 15$^{th}$ transistor coupled between the power source voltage and the third node, a gate electrode of the 15$^{th}$ transistor being coupled to the second input terminal; and a second capacitor coupled between the third node and the output terminal.

\* \* \* \* \*